United States Patent
Teo et al.

(10) Patent No.: US 10,473,712 B2
(45) Date of Patent: Nov. 12, 2019

(54) INTEGRATED CIRCUIT DEVICE TESTING IN AN INERT GAS

(71) Applicant: Infineon Technologies AG, Neubiberg (DE)

(72) Inventors: Nam Teck Shannon Teo, Singapore (SG); Giji Hervias Juele, Singapore (SG); Mohamed Rafi, Singapore (SG); Teck Hui Wong, Singapore (SG); Ming Xue, Singpaore (SG)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/390,877

(22) Filed: Dec. 27, 2016

(65) Prior Publication Data
US 2018/0180666 A1    Jun. 28, 2018

(51) Int. Cl.
*G01R 31/28* (2006.01)
*G01R 31/26* (2014.01)

(52) U.S. Cl.
CPC ..... *G01R 31/2862* (2013.01); *G01R 31/2875* (2013.01); *G01R 31/2898* (2013.01)

(58) Field of Classification Search
CPC ............ G01R 31/2862; G01R 31/2875; G01R 31/2898
See application file for complete search history.

(56) References Cited

U.S. PATENT DOCUMENTS

| | | | |
|---|---|---|---|
| 4,575,602 A * | 3/1986 | Sakurai | B23K 20/007 219/56.21 |
| 6,168,065 B1 * | 1/2001 | Willemen | B23K 1/018 228/9 |
| 6,936,826 B2 | 8/2005 | Casa et al. | |
| 2007/0205789 A1 * | 9/2007 | Heinke | G01R 31/2862 324/750.08 |
| 2011/0269922 A1 * | 11/2011 | Kang | B01J 8/1827 526/64 |
| 2013/0133339 A1 * | 5/2013 | Kim | G11C 29/56016 62/3.6 |
| 2014/0232423 A1 * | 8/2014 | Pichl | G01R 31/2891 324/750.08 |

FOREIGN PATENT DOCUMENTS

| | | |
|---|---|---|
| EP | 2 813 858 A1 | 12/2014 |
| JP | H05-288800 | 11/1993 |
| JP | H06-300778 | 10/1994 |
| JP | H10-293162 | 11/1998 |
| JP | 2001-158985 | 6/2001 |
| JP | 2003-232405 | 8/2003 |

* cited by examiner

*Primary Examiner* — Akm Zakaria
(74) *Attorney, Agent, or Firm* — Dicke, Billig & Czaja, PLLC

(57) ABSTRACT

A system includes an inert gas supply, a soak chamber, a test chamber, a transfer zone, and a heater. The soak chamber soaks an integrated circuit (IC) device in the inert gas prior to testing. The test chamber includes contact pins for testing the IC device in the inert gas by contacting the contact pins to leads of the IC device. The transfer zone is to transfer the IC device from the soak chamber to the test chamber. The heater heats the inert gas supplied to the soak chamber and the test chamber.

19 Claims, 3 Drawing Sheets

INTEGRATED CIRCUIT DEVICE TESTING IN AN INERT GAS

BACKGROUND

In the testing of integrated circuit (IC) devices, the electrical contact between testers and the IC devices is critical to the testing yield. Good units may be rejected during testing due solely to a high contact resistance between the testing pins of the tester and the leads of the IC devices. When units are initially rejected, the units are typically retested to avoid false failures. Retesting, however, requires a higher equipment capacity, increases pin material cost, and increases labor cost. An improvement in the first pass testing yield is equivalent to a productivity improvement or testing cost reduction.

For these and other reasons, there is a need for the present invention.

SUMMARY

One example of a system includes an inert gas supply, a soak chamber, a test chamber, a transfer zone, and a heater. The soak chamber soaks an integrated circuit (IC) device in the inert gas prior to testing. The test chamber includes contact pins for testing the IC device in the inert gas by contacting the contact pins to leads of the IC device. The transfer zone is to transfer the IC device from the soak chamber to the test chamber. The heater heats the inert gas supplied to the soak chamber and the test chamber.

DETAILED DESCRIPTION

In the following Detailed Description, reference is made to the accompanying drawings, which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various examples described herein may be combined with each other, unless specifically noted otherwise.

The presence of an oxidized layer on the leads of an integrated circuit (IC) device may lead to a high contact resistance during testing. Tin (Sn) plating on the leads may become oxidized prior to testing to form Tin oxide (SnO). IC devices may be tested in hot air, which increases the oxidization. Accordingly, as described herein, an inert gas at high purity and high temperature is introduced prior to and during testing to reduce the oxidation and to prevent further oxidation on the leads of the IC devices. By reducing the oxidation layer, the contact resistance during testing is reduced, thereby improving the first pass testing yield and reducing testing costs.

Figure 1:
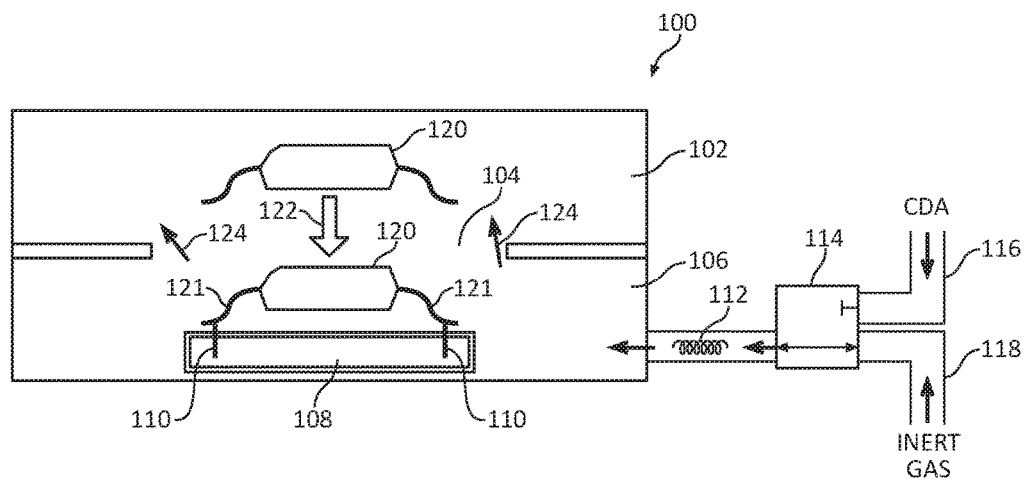
FIG. 1 illustrates one example of an integrated circuit (IC) device testing system.

FIG. 1 illustrates one example of an IC device testing system 100. IC device testing system 100 includes a soak chamber 102, a transfer zone 104, a test chamber 106, a heater 112, a valve 114, a compressed dry air (CDA) supply 116, and an inert gas supply 118. Test chamber 106 includes a tester including a socket 108 with contact pins 110. Valve 114 passes CDA or inert gas to test chamber 106. In one example, the CDA or inert gas is directed toward socket 108 of the tester. The CDA or inert gas then passes through transfer zone 104 into soak chamber 102 as indicated by arrows 124. In one example, CDA supply 116 is provided at 3 bar and at ambient temperature (e.g., approximately 25° C.). Inert gas supply 118 may also be provided at 3 bar and at ambient temperature. The flow rate of the CDA or inert gas through valve 114 may be within the range of 175 L/min and 225 L/min. Inert gas supply 118 may be supplied from a vaporizer, an advance pressure swing absorber (APSA), or another suitable source.

To prepare for testing an IC device 120, valve 114 passes inert gas to test chamber 106. The inert gas is heated by heater 112 to provide heated inert gas to test chamber 106, transfer zone 104, and soak chamber 102. In one example, heater 112 heats the inert gas to a temperature of at least 125° C. (e.g., 150° C.). The inert gas may be nitrogen ($N_2$) having a purity of at least 99.9% or another suitable inert gas. Soak chamber 102, transfer zone 104, and test chamber 106 may be maintained at a positive pressure, such as a pressure greater than 2 bars, by controlling valve 114. In one example, valve 114 may switch from supplying inert gas to supplying CDA to soak chamber 102, transfer zone 104, and test chamber 106 in response to the pressure within soak chamber 102, transfer zone 104, and test chamber 106 falling below 2 bars.

Prior to testing an IC device 120, IC device 120 is soaked in the inert gas in soak chamber 102. In one example, IC device 120 is soaked in the inert gas for at least 90 seconds prior to testing IC device 120. After soaking IC device 120 in soak chamber 102, IC device 120 is transferred to test chamber 106 through transfer zone 104 as indicated by arrow 122. IC device 120 is then tested in the inert gas in test chamber 106 by contacting contact pins 110 to leads 121 of IC device 120. By soaking IC device 120 in the inert gas in soak chamber 102 and then testing IC device 120 in the inert gas in test chamber 106, an oxidation layer on leads 121 of IC device 120 is reduced and further oxidization is prevented, thereby reducing the contact resistance between contact pins 110 and leads 121 during testing.

Figure 2:
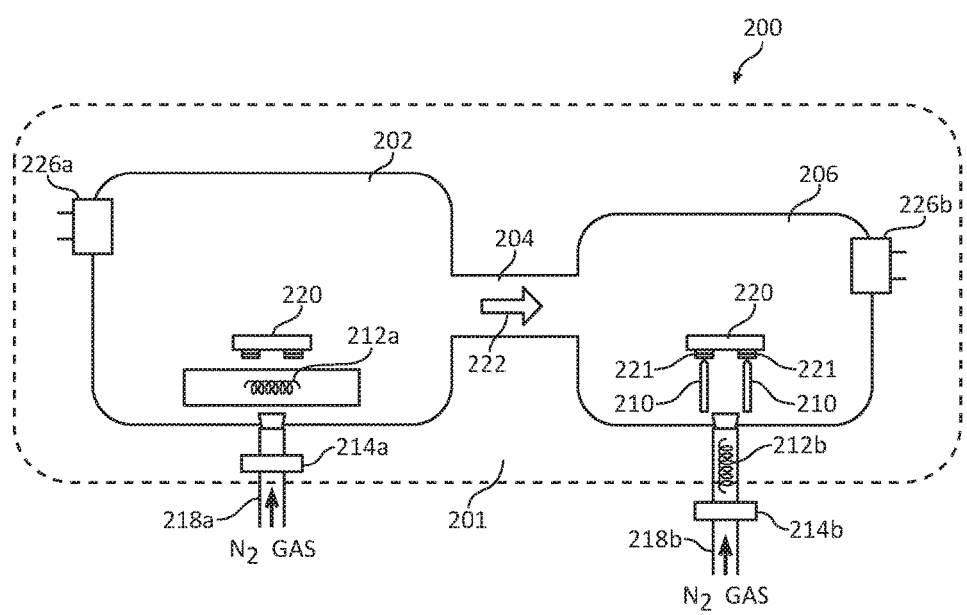
FIG. 2 illustrates another example of an IC device testing system.

FIG. 2 illustrates another example of an IC device testing system 200. IC device testing system 200 includes a soak chamber 202, a first heater 212a, a first gas supply valve 214a, a first $N_2$ gas supply 218a, a first gas outlet gate 226a, a transfer zone 204, a test chamber 206, a second heater 212b, a second gas supply valve 214b, a second $N_2$ gas supply 218b, and a second gas outlet gate 226b. Test chamber 206 includes a socket including contact pins 210. First gas supply valve 214a controls $N_2$ gas flow from $N_2$ gas supply 218a into soak chamber 202. Second gas supply valve 214b controls $N_2$ gas flow from $N_2$ gas supply 218b into test chamber 206. In one example, the $N_2$ gas is directed toward contact pins 210 of the tester. $N_2$ gas supply 218a and $N_2$ gas supply 218b may be provided at 3 bar and at ambient temperature. The flow rate of the $N_2$ gas through each valve 214a and 214b may be within the range of 175 L/min and 225 L/min. $N_2$ gas supply 218a and 218b may be supplied from a vaporizer, an APSA, or another suitable source.

To prepare for testing an IC device 220, first gas supply valve 214a passes $N_2$ gas to soak chamber 202. The $N_2$ gas is heated by heater 212a to provide heated $N_2$ gas to soak chamber 202. Second gas supply valve 214b passes $N_2$ gas to test chamber 206. The $N_2$ gas is heated by heater 212b to provide heated $N_2$ gas to test chamber 206. In one example, heaters 212a and 212b heat the $N_2$ gas to a temperature of at least 125° C. (e.g., 150° C.). The $N_2$ gas may have a purity of at least 99.9%. Soak chamber 202, transfer zone 204, and test chamber 206 may be maintained at a positive pressure, such as a pressure greater than 2 bars, by controlling first gas supply valve 214a and second gas supply valve 214b. The atmosphere 201 surrounding the outside of soak chamber 202, transfer zone 204, and test chamber 206, may be about 1 bar and composed of about 78% $N_2$.

First gas outlet gate 226a is used to control the $N_2$ gas consumption (i.e., $N_2$ gas flow out of soak chamber 202) and to maintain the purity of the $N_2$ gas within soak chamber 202. First gas outlet gate 226a is normally closed except when an IC device 220 to be tested is passed through the gate into soak chamber 202. Second gas outlet gate 226b is also used to control the $N_2$ gas consumption (i.e., $N_2$ gas flow out of test chamber 206) and to maintain the purity of the $N_2$ gas within test chamber 206. Second gas outlet gate 226b is normally closed except when an IC device 220 that has been tested is passed through the gate out of test chamber 206. In one example, in response to first gas outlet gate 226a and/or second gas outlet gate 226b being opened for a predefined period, first gas supply valve 214a and/or second gas supply valve 214b may be closed to reduce $N_2$ gas consumption. Testing may also be stopped in response to first gas outlet gate 226a and/or second gas outlet gate 226b being opened for a predefined period and/or in response to first gas supply valve 214a and/or second gas supply valve 214b being closed.

Prior to testing an IC device 220, IC device 220 is soaked in the $N_2$ gas in soak chamber 202. In one example, IC device 220 is soaked in the $N_2$ gas for at least 90 seconds prior to testing IC device 220. After soaking IC device 220 in soak chamber 202, IC device 220 is transferred to test chamber 206 through transfer zone 204 as indicated by arrow 222. IC device 220 is then tested in the $N_2$ gas in test chamber 206 by contacting contact pins 210 to leads 221 of IC device 220. By soaking IC device 220 in the $N_2$ gas in soak chamber 202 and then testing IC device 220 in the $N_2$ gas in test chamber 206, an oxidation layer on leads 221 of IC device 220 is reduced and further oxidation is prevented, thereby reducing the contact resistance between contact pins 210 and leads 221 during testing.

Figure 3:
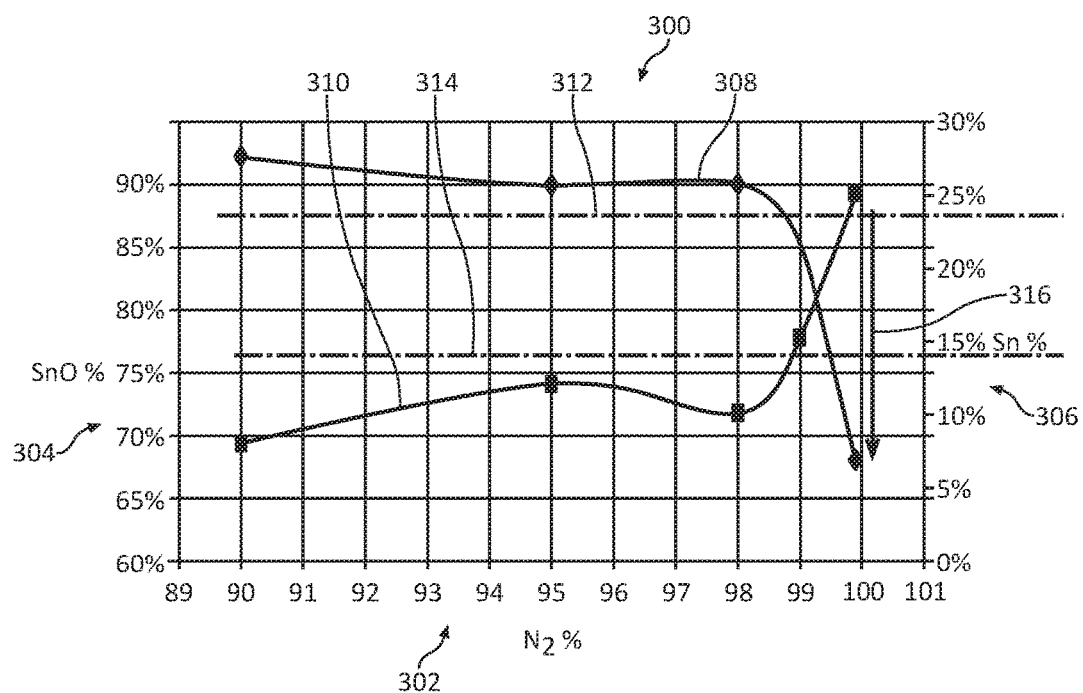
FIG. 3 is a chart illustrating one example of the atomic percentage of SnO and the atomic percentage of Sn on leads of an IC device based on the purity of $N_2$ in an IC device testing system.

FIG. 3 is a chart 300 illustrating one example of the atomic percentage of SnO and the atomic percentage of Sn on leads of an IC device based on the purity of $N_2$ in an IC device testing system, such as IC device testing system 100 previously described and illustrated with reference to FIG. 1 or IC device testing system 200 previously described and illustrated with reference to FIG. 2. Chart 300 includes $N_2$ purity in percent as indicated at 302, the atomic percentage of SnO as indicated at 304, and the atomic percentage of Sn as indicated at 306.

Line 308 represents the atomic percentage of SnO on Sn plated leads of an IC device during testing based on the purity of the $N_2$ in the soak chamber and the test chamber. Line 310 represents the atomic percentage of Sn on Sn plated leads of an IC device during testing based on the purity of the $N_2$ in the soak chamber and the test chamber. For comparison, line 312 indicates the atomic percentage of SnO on Sn plated leads of an IC device during testing when CDA is used in place of $N_2$ in the soak chamber and the test chamber. Line 314 indicates the atomic percentage of Sn on Sn plated leads of an IC device during testing when CDA is used in place of $N_2$ in the soak chamber and the test chamber. As indicated by arrow 316 in chart 300, using $N_2$ gas in the soak chamber and the test chamber at a purity of at least 99.9% and at a temperature greater than 125° C. provides about a 20% improvement in the reduction of SnO compared to using CDA.

Figure 4:
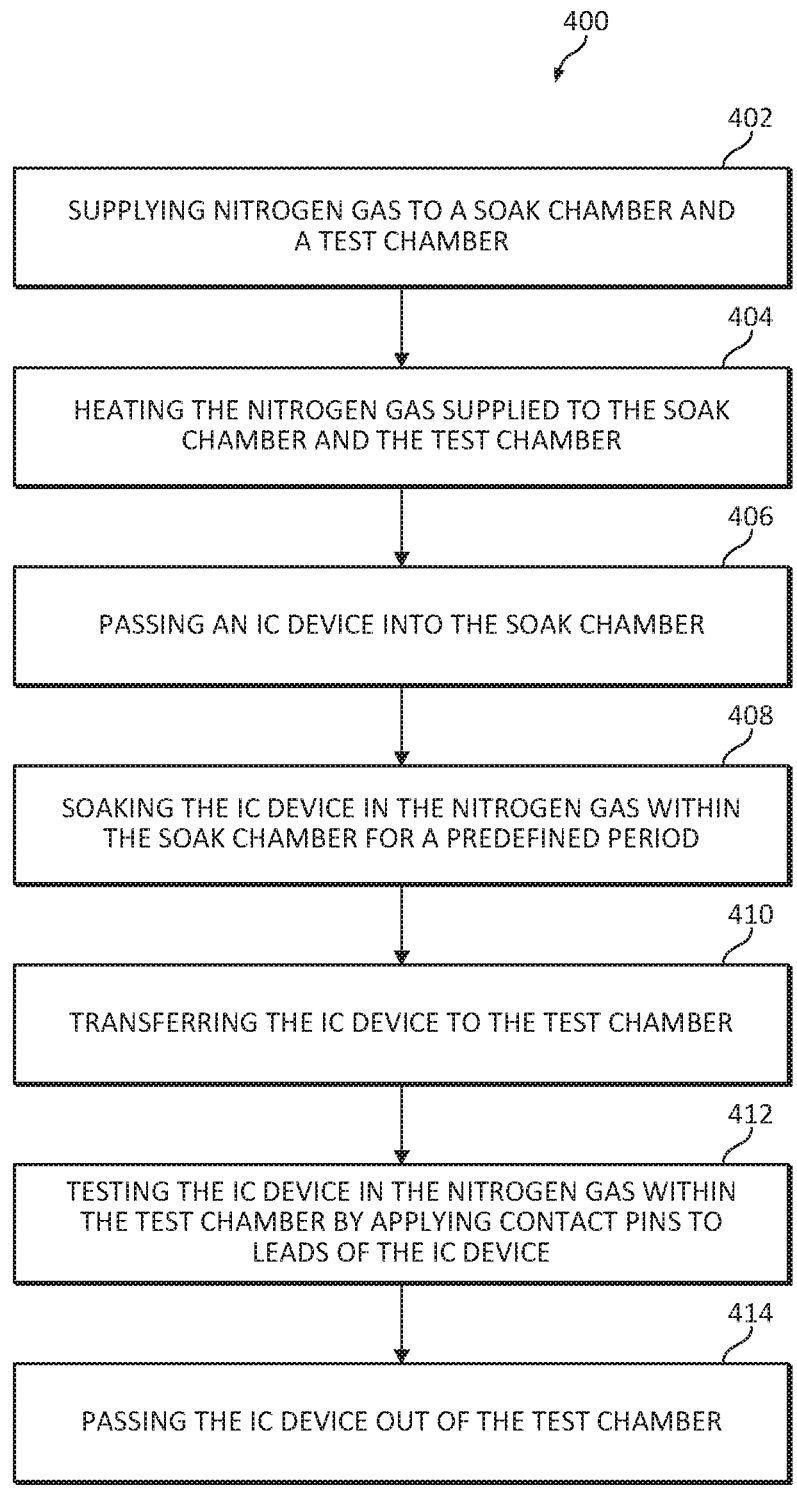
FIG. 4 is a flow diagram illustrating one example of a method for testing an IC device.

FIG. 4 is a flow diagram illustrating one example of a method 400 for testing an IC device. At 402, method 400 includes supplying nitrogen gas to a soak chamber and a test chamber. In one example, supplying the nitrogen gas includes supplying nitrogen gas having a purity of greater than 99.9%. The nitrogen gas may be supplied to maintain positive pressure within the soak chamber and the test chamber. At 404, method 400 includes heating the nitrogen gas supplied to the soak chamber and the test chamber. In one example, heating the nitrogen gas includes heating the nitrogen gas to a temperature greater than 125° C. At 406, method 400 includes passing an IC device into the soak chamber.

At 408, method 400 includes soaking the IC device in the nitrogen gas within the soak chamber for a predefined period. In one example, soaking the IC device includes soaking the IC device in the nitrogen gas for greater than 90 seconds. At 410, method 400 includes transferring the IC device to the test chamber. At 412, method 400 includes testing the IC device in the nitrogen gas within the test chamber by applying contact pins to leads of the IC device. At 414, method 400 includes passing the IC device out of the test chamber.

Method 400 may further include stopping the supply of nitrogen gas to the soak chamber and the test chamber in response to a gas outlet gate being opened for a predefined period. Testing of the IC device may be stopped in response to stopping the supply of nitrogen gas to the soak chamber and the test chamber. The testing of the IC device may also be stopped in response to a gas outlet gate being opened for a predefined period. In addition, method 400 may further include stopping the testing of the IC device in response to the pressure within the soak chamber and the test chamber falling below 2 bar.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A system comprising:
a high purity inert gas supply;
a soak chamber to soak an integrated circuit (IC) device in the high purity inert gas to reduce an oxidation layer on leads of the IC device prior to testing;
a test chamber including contact pins for testing the IC device in the high purity inert gas by contacting the contact pins to the leads of the IC device, wherein the high purity inert gas prevents further oxidation on the leads, and wherein the soak chamber and the test chamber are maintained at a pressure greater than 2 bars;

a transfer zone to transfer the IC device from the soak chamber to the test chamber; and a heater to heat the high purity inert gas supplied to the soak chamber and the test chamber.

2. The system of claim 1, wherein the high purity inert gas comprises nitrogen having a purity of at least 99.9%.

3. The system of claim 1, wherein the heater heats the high purity inert gas to at least 125° C.

4. The system of claim 1, further comprising:

a valve to control the flow of the high purity inert gas into the soak chamber and the test chamber.

5. The system of claim 3, wherein the soak chamber soaks the IC device in the high purity inert gas for at least 90 seconds prior to testing.

6. The system of claim 1, further comprising:

a gas outlet gate to control the flow of the high purity inert gas out of the soak chamber and the test chamber.

7. A system comprising:

a first gas supply valve to control high purity nitrogen gas flow into a soak chamber, the soak chamber to soak an integrated circuit (IC) device in the high purity nitrogen gas to reduce an oxidation layer on leads of the IC device prior to testing;

a second gas supply valve to control high purity nitrogen gas flow into a test chamber, the test chamber including contact pins for testing the IC device in the high purity nitrogen gas by contacting the contact pins to the leads of the IC device, wherein the high purity nitrogen gas prevents further oxidation on the leads;

a transfer zone to transfer the IC device from the soak chamber to the test chamber, wherein the first gas supply valve and the second gas supply valve are controlled to maintain a pressure within the soak chamber, the test chamber, and the transfer zone to at least 2 bars;

a first heater to heat the high purity nitrogen gas supplied to the soak chamber; and a second heater to heat the high purity nitrogen gas supplied to the test chamber.

8. The system of claim 7, further comprising:

a first gas outlet gate to control the high purity nitrogen gas flow out of the soak chamber; and a second gas outlet gate to control the high purity nitrogen gas flow out of the test chamber.

9. The system of claim 7, wherein the high purity nitrogen gas has a purity of at least 99.9%, wherein the first heater heats the high purity nitrogen gas supplied to the soak chamber to at least 125° C., and wherein the second heater heats the high purity nitrogen gas supplied to the test chamber to at least 125° C.

10. A method for testing an integrated circuit (IC) device, the method comprising:

supplying high purity nitrogen gas to a soak chamber and a test chamber, wherein the soak chamber and the test chamber are maintained at a pressure greater than 2 bars;

heating the high purity nitrogen gas supplied to the soak chamber and the test chamber;

passing the IC device into the soak chamber;

soaking the IC device in the high purity nitrogen gas within the soak chamber for a predefined period to reduce an oxidation layer on leads of the IC device;

transferring the IC device to the test chamber;

testing the IC device in the high purity nitrogen gas within the test chamber by applying contact pins to the leads of the IC device, wherein the high purity nitrogen gas prevents further oxidation on the leads; and passing the IC device out of the test chamber.

11. The method of claim 10, wherein supplying the high purity nitrogen gas comprises supplying the high purity nitrogen gas having a purity of greater than 99.9%.

12. The method of claim 10, wherein heating the high purity nitrogen gas comprises heating the high purity nitrogen gas to a temperature greater than 125° C.

13. The method of claim 10, wherein soaking the IC device comprises soaking the IC device in the high purity nitrogen gas for greater than 90 seconds.

14. The method of claim 10, further comprising:

stopping the supply of high purity nitrogen gas to the soak chamber and the test chamber in response to a gas outlet gate being opened for a predefined period.

15. The method of claim 14, further comprising:

stopping the testing of the IC device in response to stopping the supply of high purity nitrogen gas to the soak chamber and the test chamber.

16. The method of claim 10, further comprising:

stopping the testing of the IC device in response to a gas outlet gate being opened for a predefined period.

17. The method of claim 10, further comprising:

stopping the testing of the IC device in response to the pressure within the soak chamber and the test chamber falling below 2 bar.

18. The system of claim 2, wherein the heater heats the high purity inert gas to at least 125° C.

19. The system of claim 18, wherein the soak chamber soaks the IC device in the high purity inert gas for at least 90 seconds prior to testing.

* * * * *